United States Patent
Lee et al.

(10) Patent No.: US 7,068,512 B2
(45) Date of Patent: Jun. 27, 2006

(54) HEAT DISSIPATION DEVICE INCORPORATING WITH PROTECTIVE COVER

(75) Inventors: Hsieh-Kun Lee, Tu-Cheng (TW); Wan-Lin Xia, Shenzhen (CN); Tao Li, Shenzhen (CN); Bo-Yong Yang, Shenzhen (CN)

(73) Assignee: HON HAI Precision Industry Co., LTD, Tu-cheng (TW)

( * ) Notice: Subject to any disclaimer, the term of this patent is extended or adjusted under 35 U.S.C. 154(b) by 161 days.

(21) Appl. No.: 10/930,553

(22) Filed: Aug. 31, 2004

(65) Prior Publication Data
US 2005/0141203 A1    Jun. 30, 2005

(30) Foreign Application Priority Data
Dec. 26, 2003    (CN) .................... 2003 2 0128887X

(51) Int. Cl.
*H05K 7/20* (2006.01)
(52) U.S. Cl. .................... 361/704; 361/705; 361/709; 361/710; 257/706; 165/80.3; 165/185
(58) Field of Classification Search ................ 361/704, 361/709; 257/706; 165/80.3, 185; 427/258
See application file for complete search history.

(56) References Cited

U.S. PATENT DOCUMENTS

| | | | | | |
|---|---|---|---|---|---|
| 4,594,643 | A | * | 6/1986 | Hermann | 361/715 |
| 4,716,494 | A | * | 12/1987 | Bright et al. | 361/704 |
| 5,132,875 | A | * | 7/1992 | Plesinger | 361/704 |
| 5,897,917 | A | | 4/1999 | Hinshaw et al. | 422/258 |
| 6,049,458 | A | | 4/2000 | Lee et al. | 361/705 |
| 6,059,116 | A | | 5/2000 | Hinshaw et al. | 206/714 |
| 6,197,859 | B1 | * | 3/2001 | Green et al. | 524/270 |
| 6,403,882 | B1 | * | 6/2002 | Chen et al. | 174/52.4 |
| 6,835,453 | B1 | * | 12/2004 | Greenwood et al. | 428/343 |
| 6,867,977 | B1 | * | 3/2005 | DiStefano et al. | 361/705 |

* cited by examiner

*Primary Examiner*—Boris Chervinsky
(74) *Attorney, Agent, or Firm*—Morris, Manning & Martin; Tim Tingkang Xia, Esq.

(57) ABSTRACT

A heat dissipation device includes a core including a base with a bottom face and a top face and a body extending from the top face of the base, thermally conductive medium spread on the bottom face fo the base, a plurality of fin stacked along the body above the base, and a protective cover firmly disposed around the base of the core. An offset exists between the bottom face of the cover and the spread area of the medium.

14 Claims, 4 Drawing Sheets of a preferred embodiment of the present invention with attached drawings, in which:

HEAT DISSIPATION DEVICE INCORPORATING WITH PROTECTIVE COVER

TECHNICAL FIELD

The present invention relates to a heat dissipation device, and particularly to a heat dissipation device incorporating with a protective cover for protecting thermal grease spread thereon.

BACKGROUND

Electronic devices such as central processing units (CPUs) generate a lot of heat during normal operation. If the heat generated by the electronic devices is not properly dissipated, it can deteriorate their operational stability and damage associated electronic devices. Thus the heat must be removed quickly and efficiently to ensure the normal operation of these electronic devices. A heat dissipation device is often attached to a top surface of a CPU, to remove heat therefrom. Gap inevitably exists between the heat dissipation device and the CPU and hence causes reduce of heat transferring efficiency from the CPU to the heat dissipation device due to bad heat-conductive property of air in the gap. To ensure intimate contact between the CPU and the heat dissipation device, a layer of thermal grease is often spread on the bottom face of the heat dissipation device to fill up the gap between the heat dissipation device and the CPU.

In early times, thermal grease with a good heat-conductive property is spread on the bottom face of the heat sink when the heat sink is finally attached to the electronic component, and therefore the total assembly time increases. In order to reduce the assembly time of a final motherboard, thermal grease is often pre-spread onto the bottom face of the heat sink before heat sinks are sold. However, the thermal grease is soft at ambient termperature and easy to be erased away. So, a protective film for protecting the thermal grease has been developed.

FIG. 4 show a conventional protective film 1 for protecting thermal grease 3 spreaded on the bottom face of a heat sink 2. The protective film 1 covers on and directly contacts with the thermal grease 3. However, since the protective film 1 is pliable and directly contacts with the thermal grease 3, the thermal grease 3 is prone to be scraped when a force is exerted on the protective film 1.

SUMMARY OF THE INVENTION

Accordingly, an object of the present invention is to provide a heat dissipation device incorporating with a protective cover which is able to effectively protect a thermal medium spread on a heat sink.

To achieve the above-mentioned object, a heat dissipation device in accordance with the present invention comprises a core having a base with a bottom face and a top face, a body extending from the top face of the base, a thermal medium spread on the bottom face ofthe base, a plurality of fin extending from the body above the base, and a cover firmly disposed around the base of the core. An offset exists between the bottom face of the cover and the spread area of the thermal medium.

Other objects, advantages and novel features of the present invention will be drawn from the following detailed description of a preferred embodiment of the present invention with attached drawings, in which:

DESCRIPTION OF A PREFERRED EMBODIMENT

Figure 1:
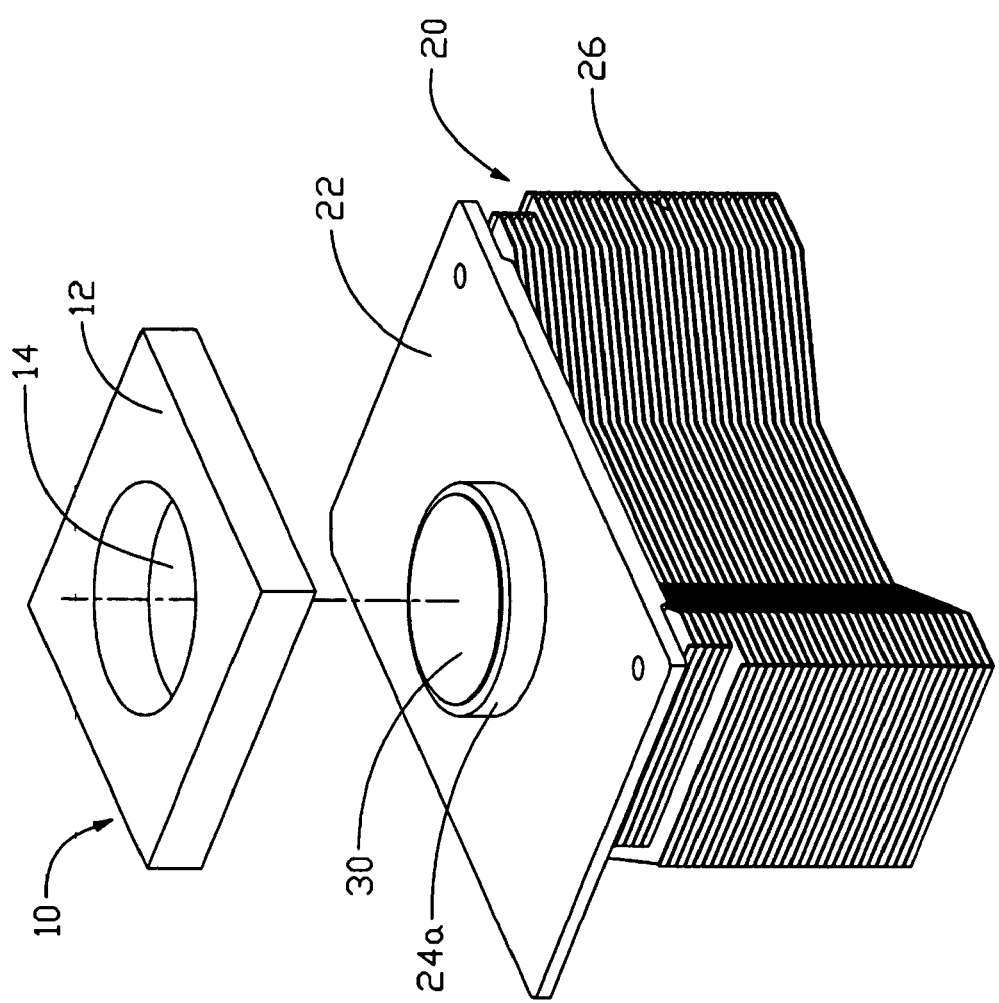
FIG. 1 is an exploded view of a heat dissipation device in accordance with an embodiment of the present invention.
Figure 2:
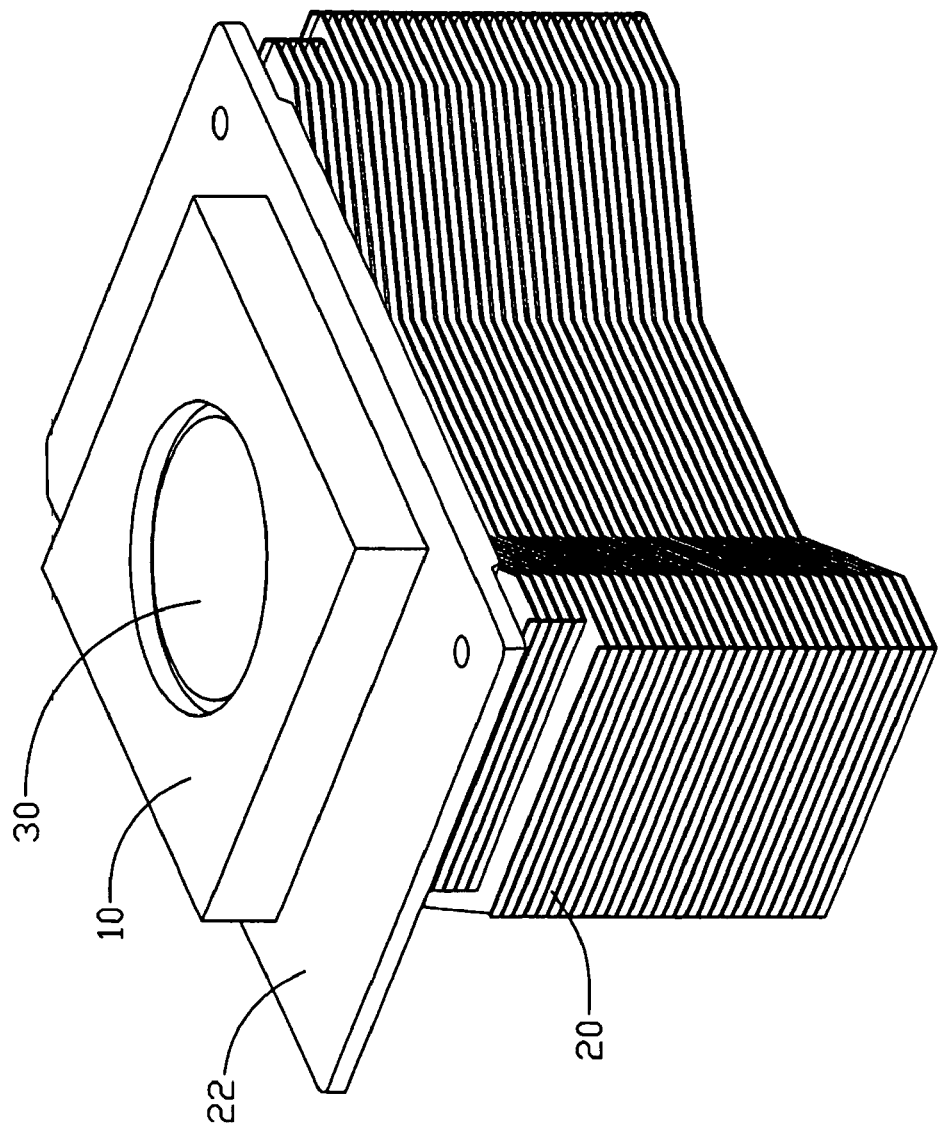
FIG. 2 is an assembled view of FIG. 1.
Figure 3:
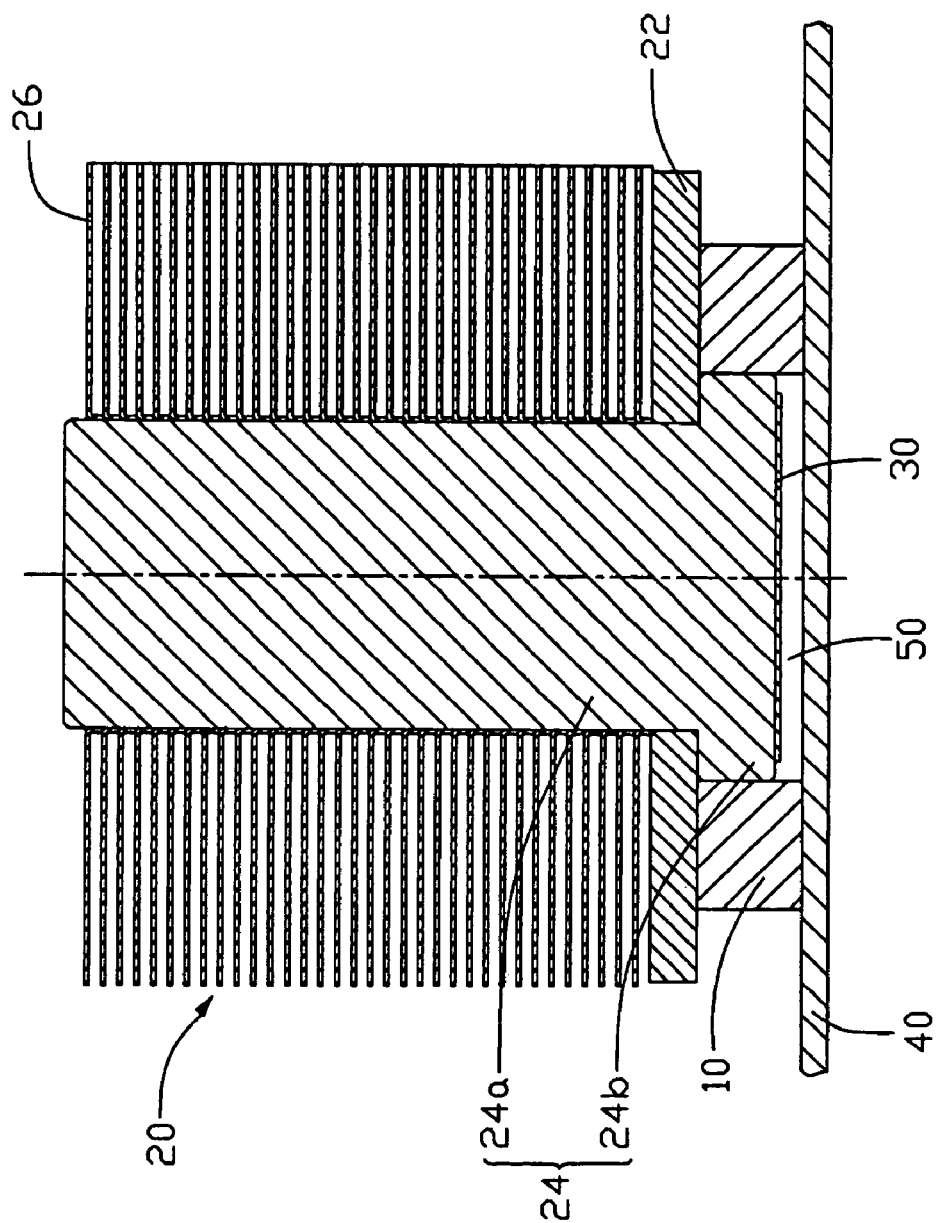
FIG. 3 is a cross-section view of FIG. 2.
Figure 4:
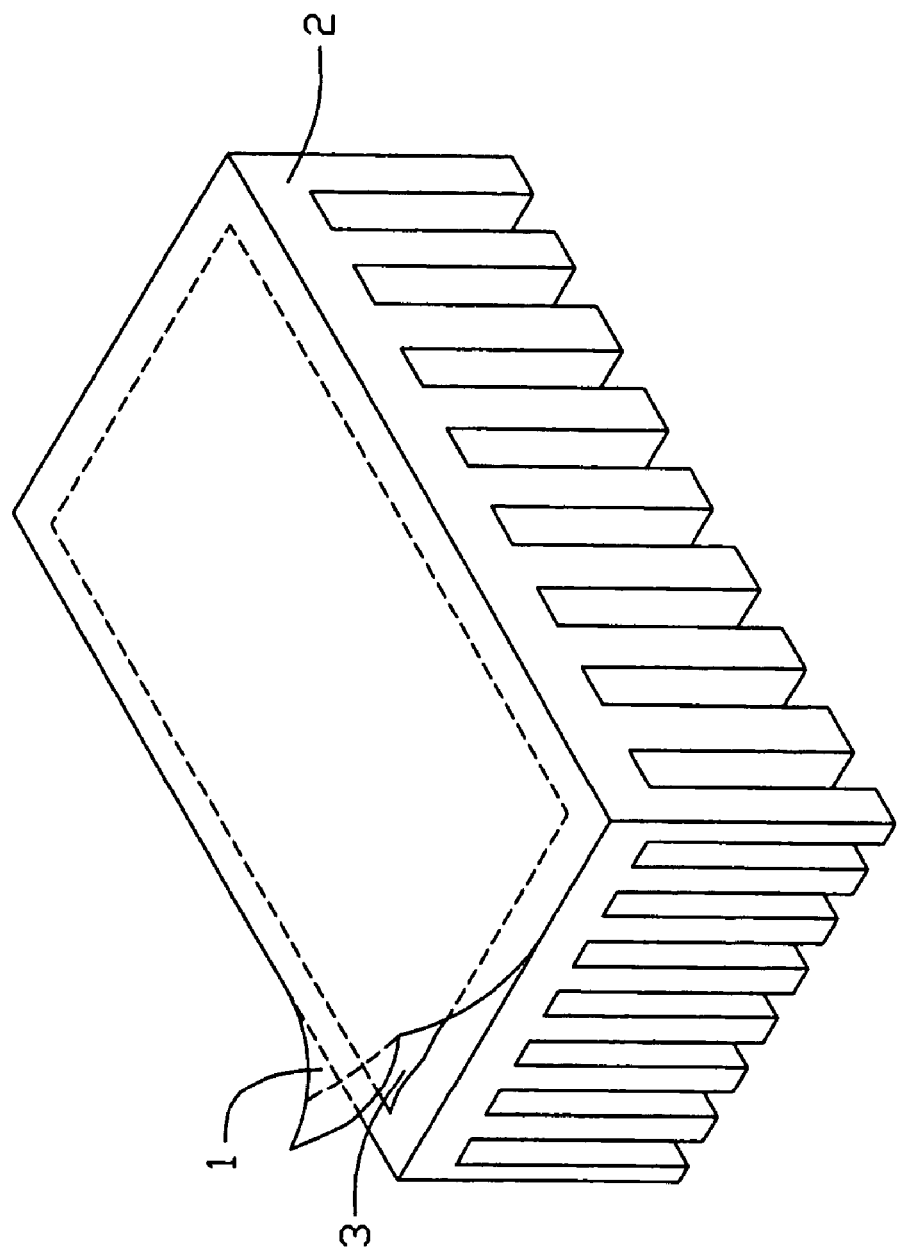
FIG. 4 shows a conventional protective device mounted on a heat sink.

Referring to FIGS. 1–3, a heat dissipation device in accordance with the preferred embodiment of the present invention comprises a protective cover 10, a heat sink 20, and a layer of a thermally conductive medium, such as thermal grease 30, spread on the heat sink 20.

The heat sink 20 comprises a rectangular base plate 22, a core 24, and a plurality of parallel fins 26. The core 24 comprises a column-shaped body 24a and a coin-shaped base 24b. The body 24a extends through the base plate 22 with the top face of the base 24b contacting with the bottom face of the base plate 22. The base 24b has a bottom face for contacting with an electronic component (not shown). The thermal grease 30 is spread on the bottom face of the base 24b. The fins 26 are disposed around and stacked along the body 24a. The thermal grease 30 is spread on the bottom face of the base 24b. The base 24b and the thermal grease 30 are located below the bottom face of the base plate 22 and expose therefrom.

The protective cover 10 is made of rubber material, such as Ethylene Vinyl Acetate (EVA) which has a good rigidity. The cover 10 comprises a wall 12 with a through opening 14 defined in a center thereof. The diameter of the through opening 14 is slightly smaller than that of the base 24b of the core 24 of the heat sink 20. The cover 10 is attached to the bottom of the heat sink 20 with the base 24b of the core 24 of the heat sink 20 interferentially received in the opening 14 of the cover 10. The cover 10 is elastically deformed and firmly attached to and around the base 24b of the core 24. The depth of the wall 12 of the cover 10 is larger than that of the base 24b of the core 24 together with that of the thermal grease 30 to thereby form an offset between the bottom face of the wall 12 and the layer of thermal grease 30.

Referring to FIG. 3, the combined heat sink 20 and protective cover 10 is received in a box which has a bottom plate 40. The protective cover 10 is placed on the bottom plate 40 to cooperatively form an enclosed cavity 50. The thermal grease 30 is spaced from the bottom plate 40 since the offset exists between the bottom face of the wall 12 and the thermal grease 30. The thermal grease 30 is received in the enclosed cavity 50 and protected from being contaminated by dust or foreign particles.

In the present invention, the cover 10 is made of rubber material which has a good elasticity. Thus, the cover 10 is capable of being firmly attached to the base 24b of the core 24 of the heat sink 20 and conveniently detached from the base 24a. Furthermore, the bottom plate 40 is spaced from the thermal grease 30 and the cover 10 is not easily deformed due to having a good rigidity, which results in the thermal grease 30 being protected from being scraped when the combined heat sink 20, cover 10 and bottom plate 40 suffers a force.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A combination comprising:
   a core comprising a base with a bottom face adapted for spreading a thermally conductive medium thereon, and a body extending from a top face of the base;
   a plurality of fins extending from the body above the base;
   a cover firmly disposed around the base of the core; and
   a bottom plate enclosing the bottom of the cover and spaced from the bottom face of the base to thereby forming an enclosed cavity between the bottom plate, the cover and the base for enclosing the medium therein.

2. The combination as claimed in claim 1, wherein the cover is made of rubber material.

3. The combination as claimed in claim 2, wherein the depth of the cover is larger than that of the base of the core.

4. The combination as claimed in claim 3, wherein the body of the core is column-shaped.

5. The combination as claimed in claim 4, wherein the fins are stacked along the body.

6. The combination as claimed in claim 5, further comprising a base plate disposes around the body below the fins and the bottom face of the base plate contacts with the top faces of the cover and the base of the core.

7. A combination comprising:
   a core comprising a base with a bottom face and a top face, and a body extending from the top face of the base;
   a thermally conductive medium spread on the bottom face fo the base; a plurality of fins extending from the body above the base; and
   a cover firmly disposed around the base of the core, an offset existing between the bottom face of the cover and the medium.

8. The combination as recited in claim 7, further comprising a bottom plate enclosing the bottom of the cover so that the medium is enclosed.

9. The combination as recited in claim 8, wherein the cover comprises a wall with a through opening defined therein, the base of the core being interferentially received in the opening.

10. The combination as recited in claim 9, wherein the diameter of the through opening of the cover is slightly smaller than that of the base of the core.

11. The combination as recited in claim 10, wherein the cover is made of rubber material which has a good rigidity.

12. A combination comprising:
   a heat dissipation device having a core with a face having a size substantially same as a heat-generating electronic component so as to contact said heat-generating electronic component by means of said face, a plurality of heat-dissipation fins extending from said core to dissipate heat of said heat-generating electronic component transmitted via said core;
   a thermally conductive medium spread on said face of said core in an area substantially same as said size of said face, said thermally conductive medium having a first thickness away from said face of said core; and
   a protective cover disposed around said surface of said core, said protective cover providing a receiving space to receive said thermally conductive medium incorporating with said surface of said core, and a second thickness of said protective cover away from said face of said core being larger than said first thickness.

13. The combination as claimed in claim 12, wherein said protective cover is made of rubber material.

14. The combination as claimed in claim 12, wherein said plurality of heat-dissipation fins is disposed parallel to said face of said core, and each of said fins has an extending area larger than said size of said face.

* * * * *